(12) United States Patent
Feng

(10) Patent No.: US 10,115,881 B2
(45) Date of Patent: Oct. 30, 2018

(54) PORTABLE LIGHTING DEVICE WITH THERMOELECTRIC POWER SOURCE

(71) Applicant: Dongguan Hewang Electric Co. Ltd, Dongguan (CN)

(72) Inventor: Chaohui Feng, Dongguan (CN)

(73) Assignee: DONGGUAN HEWANG ELECTRIC CO., LTD., Dongguan (CN)

( * ) Notice: Subject to any disclaimer, the term of this patent is extended or adjusted under 35 U.S.C. 154(b) by 133 days.

(21) Appl. No.: 14/896,151

(22) PCT Filed: May 30, 2014

(86) PCT No.: PCT/CN2014/078880
§ 371 (c)(1),
(2) Date: Dec. 4, 2015

(87) PCT Pub. No.: WO2014/194792
PCT Pub. Date: Dec. 11, 2014

(65) Prior Publication Data
US 2016/0118569 A1    Apr. 28, 2016

(30) Foreign Application Priority Data
Jun. 4, 2013    (CN) .......................... 2013 1 0219930

(51) Int. Cl.
| F21L 13/00 | (2006.01) |
| H01L 35/32 | (2006.01) |
| F21S 9/04 | (2006.01) |
| F21V 29/58 | (2015.01) |
| F21V 29/70 | (2015.01) |
| F21V 29/74 | (2015.01) |

(Continued)

(52) U.S. Cl.
CPC .............. *H01L 35/32* (2013.01); *F21L 13/00* (2013.01); *F21S 9/04* (2013.01); *F21V 23/003* (2013.01); *F21V 23/0414* (2013.01); *F21V 29/58* (2015.01); *F21V 29/70* (2015.01); *F21V 29/74* (2015.01); *F21V 29/90* (2015.01); *H01L 35/16* (2013.01); *H01L 35/18* (2013.01); *H01L 35/30* (2013.01); *F21Y 2115/10* (2016.08)

(58) Field of Classification Search
CPC ........ F21V 23/02; F21V 23/023; F21V 21/22; F21V 21/32; F21L 13/00; F21L 14/00; H05B 37/00; H05B 41/2822
See application file for complete search history.

(56) References Cited

U.S. PATENT DOCUMENTS 3,586,270 A * 6/1971 Loffler .................... F21V 21/22
                                                362/486
4,181,929 A * 1/1980 Barber .................... F21S 9/022
                                                248/167

(Continued)

*Primary Examiner* — Ismael Negron
(74) *Attorney, Agent, or Firm* — Gokalp Bayramoglu

(57) ABSTRACT

A lighting device which includes a light emitting unit, a thermoelectric power generation module for powering the light emitting unit, a top panel supporting the light emitting unit, and an adjustment rod connecting the thermoelectric power generation module with the top panel. The thermoelectric power generation module features hot and a cold sides, includes a heat dissipation unit proximal to the cold side, a thermoelectric power generation chip set, a heat supply box proximal to the hot side and a combustion chamber connected to the heat supply box.

19 Claims, 3 Drawing Sheets

(51) Int. Cl.
    *F21V 29/90*     (2015.01)
    *F21V 23/00*     (2015.01)
    *F21V 23/04*     (2006.01)
    *H01L 35/16*     (2006.01)
    *H01L 35/18*     (2006.01)
    *H01L 35/30*     (2006.01)
    *F21Y 115/10*     (2016.01)

(56) References Cited

U.S. PATENT DOCUMENTS

| | | | | |
|---|---|---|---|---|
| 5,288,336 | A * | 2/1994 | Strachan | H01L 35/00 |
| | | | | 136/200 |
| 7,168,363 | B1 * | 1/2007 | Brown | A47J 37/0786 |
| | | | | 126/25 R |
| 7,470,036 | B2 * | 12/2008 | Deighton | F21L 14/04 |
| | | | | 362/109 |
| 8,297,271 | B2 * | 10/2012 | Cedar | F23B 20/00 |
| | | | | 110/188 |
| 8,497,515 | B1 * | 7/2013 | Sagal | H01L 33/645 |
| | | | | 257/724 |
| 8,618,406 | B1 * | 12/2013 | Bilak | H01L 35/30 |
| | | | | 136/200 |
| 2006/0016446 | A1 * | 1/2006 | Hu | F24C 3/00 |
| | | | | 126/41 R |
| 2008/0142067 | A1 * | 6/2008 | Dell | H01L 35/30 |
| | | | | 136/201 |
| 2010/0012165 | A1 * | 1/2010 | Bedard | A47J 37/0786 |
| | | | | 136/205 |
| 2011/0155200 | A1 * | 6/2011 | Simka | H01L 35/30 |
| | | | | 136/205 |
| 2014/0026933 | A1 * | 1/2014 | Kell | H01L 35/32 |
| | | | | 136/205 |

* cited by examiner

PORTABLE LIGHTING DEVICE WITH THERMOELECTRIC POWER SOURCE

CROSS REFERENCE TO RELATED APPLICATION

This is a national phase national application of an international patent application number PCT/CN2014/078880 with a filing date of May 30, 2014, which claimed priority of one foreign application in China: application number 201310219930.1 and filing date Jun. 4, 2013. The contents of these specifications, including any intervening amendments thereto, are incorporated herein by reference.

BACKGROUND OF THE PRESENT INVENTION

Field of Invention

The present invention relates to a lighting technology, and more particularly to a portable lighting device based on principle of thermoelectric power generation.

Description of Related Arts

In our social reality, lighting has already become a necessity for people's lives. At present, the majority of lighting devices are based on power generation from electricity. With the increasingly scarcity of the world's energy sources, the widespread application of electrical energy powered lighting will lead to the demanding supply of electrical energy sources, and especially during the summer peak period, the seriously shortage of electrical energy source may even affect the everyday lighting need of people. In addition, as more people are traveling and have great demand for portable lighting, people tend to use new energy sources other than electric energy source for lighting. Since thermoelectric power technology was invented, studies on lighting by thermoelectric power are never stopped. Thermoelectric power is a relatively easy way to providing lighting in the absence of electrical power. However, light apparatus in the existing technologies is far from practical application in the market. For examples, the thermoelectric LED lighting apparatus disclosed in the patent number 201220321281.7 mainly includes a lighting apparatus 1, thermoelectric power generation module 2 and a power storage device 3. As shown in FIG. 1 of the drawings, the thermoelectric power generation module 2 is a semiconductor thermoelectric power generation chip utilizing the temperature differences between the hot side and the cold side to generate power continuously for the lighting apparatus 1. This type of thermoelectric lighting apparatus in the existing technologies, in general, has the following major drawbacks: the thermoelectric power generation efficiency is low and the power generation capacity is low. This is caused by the relatively low temperature differences between the two sides of the thermoelectric power generation chip, which is the main constraint of the development in this technological area. In the existing technology, there is no solutions to solve the above problems, which is the solution to maintain a relatively large temperature differences between the two sides of the thermoelectric power generation chip. This leads to the light apparatus in the existing technologies fails to provide lighting to meet the actual application need. In addition, the instability of temperature differences also makes it difficult to provide a stable lighting output in actual use. At present, in this aspect, some improvement to ensuring temperature difference through large size radiators are emerged. However, this type of improvement will lead to the entire lighting apparatus to have a huge size and the cost effectiveness is even lower than lighting by using electricity directly. Accordingly, the subject of how to provide a non-electrical powered lighting devices with high power generation efficiency and convenient for carriage against these drawbacks in thermoelectric power generation has a very broad market prospects and which is the essential demand in this technological development.

SUMMARY OF THE PRESENT INVENTION

The present invention solve the above problems in the existing technology through long-term experimental studies to provide an innovative thermoelectric lighting device which has a high thermoelectric power generation capacity, a high power generation efficiency and is very convenient to carry. The thermoelectric lighting device of the present invention, through an innovative design of a thermoelectric power generation chip, a light emitting unit, a heat dissipation unit and heat supply unit, solves the technological bottleneck problem described in the description of related arts, greatly increases the thermoelectric power generation capacity and the power generation efficiency, hence the actual lighting need can be meet. Also, a portable design is used for the entire lighting device, hence the level of practical application in the market for this type of thermoelectric lighting device is greatly increased.

Accordingly, in order to solve the above technological problems, the present invention provides the following technological solution:

A thermoelectric lighting device, which comprises a thermoelectric power generation module 001, an adjustment rod 002, a light emitting unit 003 and a mounting top panel 004, wherein the light emitting unit 003 is mounted onto a surface of the mounting top panel 004, the mounting top panel 004 and the thermoelectric power generation module 001 are connected through the adjustment rod 002, the thermoelectric power generation module 001 comprises a heat dissipation unit 100, a thermoelectric power generation chip set 110, a heat supply box 120 and a combustion chamber 130, the thermoelectric power generation chip set 110 has a hot and a cold sides for power generation based on the temperature differences between the hot and the cold sides and has a laminated composite structure in which the laminated structure is formed by different thermoelectric power generation materials which work under different temperature ranges from the cold side to the hot side sequentially, the cold side of the thermoelectric power generation chip set 110 is in close contact with the heat dissipation unit 100, the hot side of the thermoelectric power generation chip set 110 is in close contact with the heat supply box 120, the heat supply box 120 has a bottom portion connected to the combustion chamber 130.

Furthermore, according to the thermoelectric lighting device of the present invention, wherein the thermoelectric power generation chip set 110 in the cold side comprises a $Bi_2Te_3$—$Bi_2Se_3$ thermoelectric power generation sheet with a relatively high figure-of-merit at a temperature range of 0~300 degree Celsius, then a solid solution of PbTe, PbTe and SnTe or PbSe with a relatively high figure-of-merit at a temperature range of 300~600 degree Celsius after the $Bi_2Te_3$—$Bi_2Se_3$ thermoelectric power generation sheet, and a GeTe and/or $AgSbTe_2$ thermoelectric power generation sheet, and in the hot side comprises a Ge—Si alloy and/or MnTe thermoelectric power generation sheet with a relatively high figure-of-merit at a temperature above 600 degree Celsius.

Furthermore, according to the thermoelectric lighting device of the present invention, wherein the thermoelectric power generation chip set 110 has a thermoelectric power generation efficiency above 30% and is constructed by one of the followings: (1) $Bi_2Te_3$—$Bi_2Se_3$ with 5 mm thickness/PbTe with 3 mm thickness/PbSe solid solution with 3 mm thickness/Ge—Si alloy with 8 mm thickness; (2) $Bi_2Te_3$—$Bi_2Se_3$ with 5 mm thickness/PbTe and SnTe with 3 mm thickness/Ge—Si alloy with 8 mm thickness; (3) $Bi_2Te_3$—$Bi_2Se_3$ with 5 mm thickness/PbSe solid solution with 3 mm thickness/$AgSbTe_2$ with 3 mm thickness/Ge—Si alloy with 6 mm thickness/MnTe with 3 mm thickness; (4) $Bi_2Te_3$—$Bi_2Se_3$ with 4 mm thickness/GeTe with 3 mm thickness/$AgSbTe_2$ with 3 mm thickness/Ge—Si alloy with 4 mm thickness/MnTe with 5 mm thickness; (5) $Bi_2Te_3$—$Bi_2Se_3$ with 5 mm thickness/PbSe solid solution with 3 mm thickness/$AgSbTe_2$ with 3 mm thickness/MnTe with 6 mm thickness.

Furthermore, according to the thermoelectric lighting device of the present invention, wherein the heat dissipation unit 100 comprises a main heat dissipation sheet 101, a micro heat dissipation sheet 102, a heat dissipation sidewall 103, an impeller 104 and a heat dissipation base 105; the heat dissipation base 105 extends vertically upwards to form the heat dissipation sidewall 103, the heat dissipation sidewall 103 has an outer side in close contact to the thermoelectric power generation chip set 110 and an inner side extended vertically to form the main heat dissipation sheet 101, the heat dissipation unit 100 has an overall structure in comb shape, a coolant tank is defined through an inner portion of the heat dissipation base 105, a coolant channel is defined through an inner connecting portion of the main heat dissipation sheet 101 and the heat dissipation sidewall and is channel through to the coolant tank in the heat dissipation base 105, the coolant tank contains coolant and the coolant is a superconducting coolant manufactured by potassium dichromate and/or potassium sulfate, the impeller 104 is positioned inside the coolant tank in the heat dissipation base 105, the micro heat dissipation sheet 102 is arranged on a surface of the main heat dissipation sheet 101, the heat dissipation base 105 and the heat dissipation sidewall 103 of which the surface is not in close contact with the thermoelectric power generation chip set 110.

Furthermore, according to the thermoelectric lighting device of the present invention, wherein the micro heat dissipation sheet 102 is made by heat dissipation materials which comprises additional fiber capillary tubes in the middle, the heat dissipation unit 100 is made in copper or aluminum, each of the main heat dissipation sheet 101 has a thickness of 8-15 mm and has a gap of 8-15 mm with each other, each of the micro heat dissipation sheet 102 has a thickness of 0.5-2 mm and has a gap of 1.5-3 with each other.

Furthermore, according to the thermoelectric lighting device of the present invention, wherein the heat supply box 120 comprises a copper wall 121, a water tank 122, an insulating wall 123, an exhaust holes 124, a connecting sliding groove 125, a copper base 126 and a connecting magnet 127, the heat supply box 120 has an overall structure of rectangular box structure and forms the copper wall 121 with a thickness greater than 20 mm on a side close to the thermoelectric power generation chip set 110, the copper wall 121 has a bottom portion integrally and outwardly extended vertically to the copper base 126, the copper base 126 has a thickness smaller than 20 mm, the copper wall 121 and the copper base 126 are arranged for forming two wall panels for the water tank 122, the other panels of the water tank 122 are formed by the insulating wall 123, the exhaust hole 124 is arranged on the insulating wall 123 which is positioned on a top portion of the water tank 122, the connecting groove 125 are provided on two sides of the copper base 126, the connecting magnet 127 is provided on a front side of the copper base 126.

Furthermore, according to the thermoelectric lighting device of the present invention, wherein the combustion chamber 130 has a rectangular box body, the rectangular box body comprises a stationary panel 135 on a bottom portion thereof, a plurality of positioning holes for combustion heat source on the stationary panel 135, a flame control plate 136 is provided in the upper portion near an opening of the rectangular box body, the flame control plate 136 is arranged for adjusting a flame size of the combustion heat source positioned in the stationary panel, a connecting ribs 132 is provided on a top portion at two sidewalls of the rectangular box body, the combustion chamber is connected to a bottom of the heat supply box through inserting the connecting ribs 132 into the corresponding connecting groove 125 of the heat supply box, a magnetic block 131 is provided which is attracted to and corresponded to the connecting magnet 127 of the heat supply box for accurate alignment of the combustion chamber and the heat supply box, the combustion chamber has a sidewall which is close to the thermoelectric power generation chip set 110 forms an insulation sidewall 133, the other sidewalls of the box body of the combustion chamber has oxygen supply holes.

Furthermore, according to the thermoelectric lighting device of the present invention, wherein the flame control plate 136 comprises an extendable plate 137 and an adjustment bar 139, the extendable plate is formed by overlapping cover plates and is connected to the adjustment bar 139 through a link drive mechanism, through operating the adjustment bar 139, an extension level of the extendable plate 137 can be adjusted, hence changing a size of a flame outlet 138 between each the extension plate while the flame outlet 138 remains its position on the positioning hole.

Furthermore, according to the thermoelectric lighting device of the present invention, wherein the adjustment rod 002 comprises a main rod 201 and am extendable rod 202, the extendable rod 202 extended inside the main rod 201, the main rod 201 has a bottom end connected to a top surface of a body of the thermoelectric power generation module 001 through a rotary shaft, an illumination angle of the light emitting unit 003 is adjusted through adjusting an angle between the mounting top panel 004 and the adjustment rod 002, and an angle between the adjustment rod 002 and the thermoelectric power generation module, a locking device for locking the extendable rod 202 into position is provided on a sidewall at an open end of the main rod 201.

Furthermore, according to the thermoelectric lighting device of the present invention, wherein the locking device comprises a gap 203 opening on the main rod 201, a lever 204, a spring 205, a triangular support 206 and a pushing handle 207, the triangular support 206 is secured on an outer sidewall of the main rod 201 at a position close to the gap 203, the lever 204 comprises a pressing block in a top portion vertically inserted into the gap 203, the lever 204 has a middle portion rotatably connected onto the triangular support 206, and a bottom end of the lever 204 defines the pushing handle 207 for facilitating pressing action, the spring 205 is provided between the gap 203 and the triangular support 206, the spring 205 has two ends secured onto an outer sidewall of the lever 204 and the main rod 201 respectively such that the pressing block of the lever 204 penetrates through the gap 203 to resiliently pressing against the extendable rod 202 inside the main rod 201 and locking the extendable rod 202 into position inside the main rod.

Furthermore, according to the thermoelectric lighting device of the present invention, wherein the light emitting unit 003 comprises a reflective cup 301, a condenser lens 302, a lighting cover 303, a thermoelectric power generation sheet 304, heat dissipation fins 305, a LED 306 and installation fins 307, an installation spot is arranged for the LED 306 at a bottom portion of the reflective cup 301, wiring hole is provided on a center in a bottom of the installation spot, a reflective film is coated onto an inner wall surface of the reflective cup 301, a wedged-shaped groove is provided circumferentially at a position on an inner wall of the reflective cup and is close to the LED 306, a converging lens structure is defined by a central portion of the condenser lens 302 and a resilient flange structure, which is compressible, is defined by a peripheral portion of the condenser lens 302, the thermoelectric power generation sheet 304 is positioned at an inner side of a cup wall of the reflective cup 301, the thermoelectric power generation sheet 304 is a $Bi_2Te_3$—$Bi_2Se_3$ thermoelectric power generation sheet with a thickness of 3-5 mm thickness in which a wiring opening is provided on a bottom center portion thereof, a bottom surface of the LED 306 is in contact with the thermoelectric power generation sheet 304, the reflective cup 301 has an outer side on which a plurality of heat dissipation fins 305 in a spiral pattern are arranged, a spiral groove is provided peripherally at an inner edge of the lighting cover 303, the spiral groove is screwed with the spiral pattern of the heat dissipation fins 305 on the outer side of the reflective cup 301 to install the lighting cover 303 onto the reflective cup 301, the reflective cup 301 has a bottom portion at which the installation fins 307 are provided.

Furthermore, according to the thermoelectric lighting device of the present invention, wherein a power control circuit for controlling the power generated by the thermoelectric power generation module 001 and the light emitting unit 003 and a light emitting driving circuit for controlling the LED of the light emitting unit are provided inside the mounting top panel 004, the power control circuit comprises a selective toggle switch, the selective toggle switch enables switching between a series connection or a parallel connection for power generation from the thermoelectric power generation module 001 and the light emitting unit 003.

Furthermore, according to the thermoelectric lighting device of the present invention, wherein the power control circuit further comprises a power storage module with an external USB port, the power storage module is capable of automatically storing the thermoelectric power generated internally and charging by utilizing external power through the USB port.

Through to the technological solution of the present invention, at least the following advantageous effect are achieved:

1. Provide lighting through converting heat energy to electricity, saving electrical power effectively
2. Through innovative design of thermoelectric power generation chip and light emitting unit, dramatically increase the thermoelectric power generation efficiency in thermoelectric power generation, greatly increase the level of practical application in the market for thermoelectric lighting device.
3. The entire lighting device according to the present invention has a compact size, its operation is simple, and fully meet the application demand of portable lighting device, thus its market prospects are very broad.

In the figures, the numerical references refer to the followings:

1—lighting apparatus, 2—thermoelectric power generation module, 3—power storage device 001—power generation model, 002—adjustment rod, 003—light emitting unit, 004—mounting top panel;

100 heat dissipation unit, 101 main heat dissipation sheet, 102 micro heat dissipation sheet, 103 heat dissipation sidewall, 104 impeller, 105 heat dissipation base;

110 thermoelectric power generation chip set;

120—heat supply box, 121 copper wall, 122 water tank, 123 insulating wall, 124 exhaust hole, 125 connecting sliding groove, 126 copper base, 127 connecting magnet;

130 combustion chamber, 131 magnetic block, 132 connecting ribs, 133 insulation sidewall, 134 candle, 135 stationary panel, 136 flame control plate, 137 extendable plate, 138 flame outlet, 139 adjustment bar;

201 main rod, 202 extendable rod, 203 gap, 204 lever, 205 spring, 206 triangular support, 207 pushing handling;

301 reflective cup, 302 condenser lens, 303 lighting cover, 304 thermoelectric power generation sheet, 305 heat dissipation fins, 306 LED, 307 installation fin, 308, wiring hole.

DETAILED DESCRIPTION OF THE PREFERRED EMBODIMENT

Figure 1:
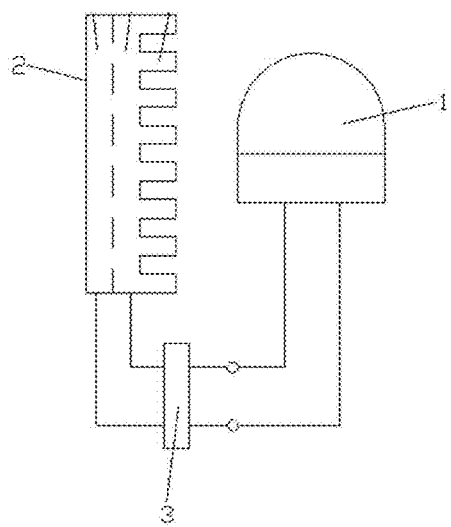
FIG. 1 is a structural illustration of an existing thermoelectric LED lighting apparatus.
Figure 2:
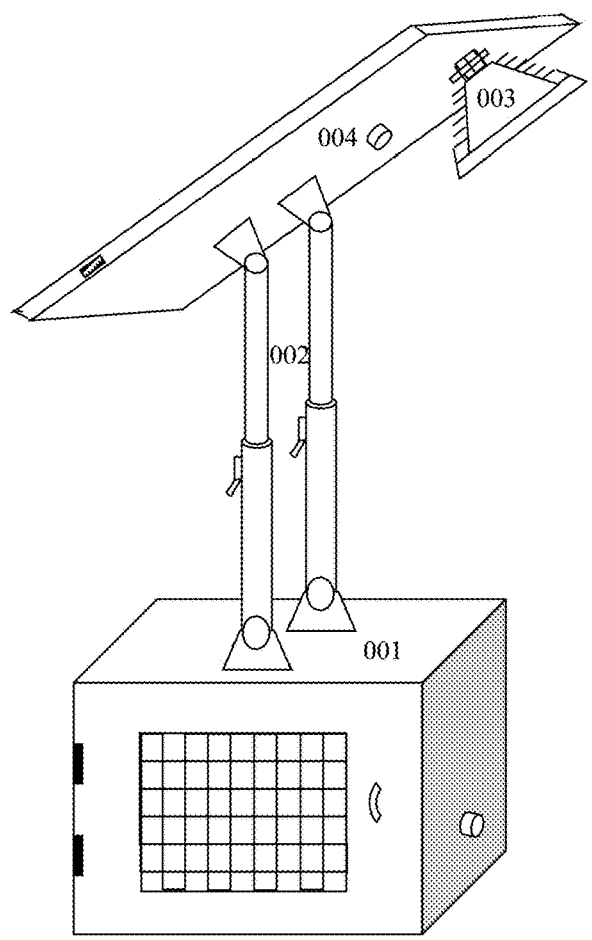
FIG. 2 is a structural illustration for the entire design of the thermoelectric lighting device according to the preferred embodiment of the present invention.

Referring to FIG. 2 of the drawings, the overall design of a thermoelectric lighting device according to the preferred embodiment of the present invention includes a thermoelectric power generation module 001, an adjustment rod 002, a light emitting unit 003 and a mounting top panel 004, wherein the light emitting unit 003 is mounted onto a surface of the mounting top panel 004, the mounting top panel 004 and the thermoelectric power generation module 001 are connected through the adjustment rod 002, the adjustment rod 002 has a bottom end connected to a top surface of a body of the thermoelectric power generation module 001 through rotary shaft connection, the adjustment rod 002 has a top end connected to an inner surface of the mounting top panel 004 through rotary shaft connection, while the adjustment rod 002 is capable of extending along its length for length adjustment such that an illumination direction of the light emitting unit 003 can be adjusted freely, the illumination direction of the light emitting unit 003 can be adjusted through adjusting an angle between the mounting top panel 004 and the adjustment rod 002, and an angle between the adjustment rod 002 and the thermoelectric power generation module, an illumination height of the light emitting unit 003 can be adjusted through adjusting the length of the adjustment rod 002. Control circuit parts are arranged inside the mounting top panel 004, which includes lighting control for the light emitting unit 003. The control circuit parts electrically connect to an output terminal of the thermoelectric power generation module 001 through the connecting wires inside the adjustment rod 002 and utilizes the electrical power from the thermoelectric power generation module 001 to drive the light emitting unit 003 for providing illumination.

Figure 3:
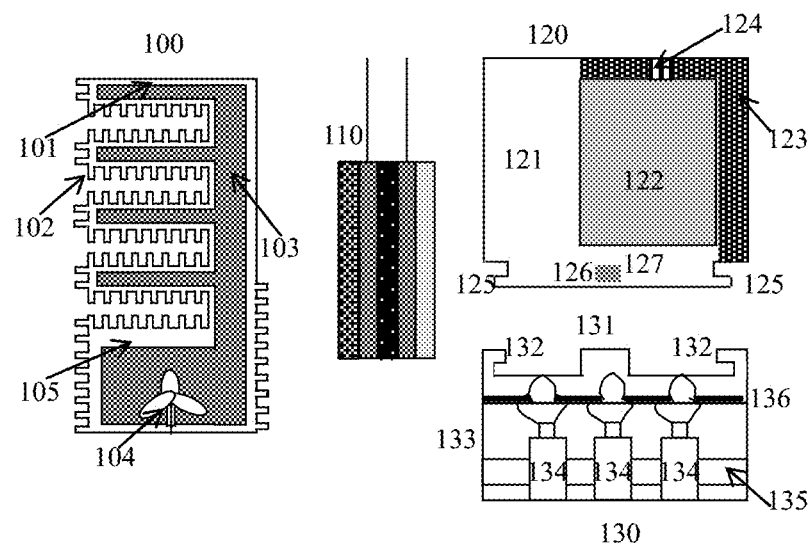
FIG. 3 is an exploded illustration showing the internal structure of the thermoelectric power generation module of the thermoelectric lighting device according to the preferred embodiment of the present invention.
Figure 4:
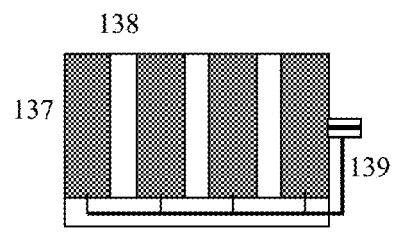
FIG. 4 is a structural illustration showing the flame control plate of the thermoelectric power generation module of FIG. 3 according to the preferred embodiment of the present invention.
Figure 5:
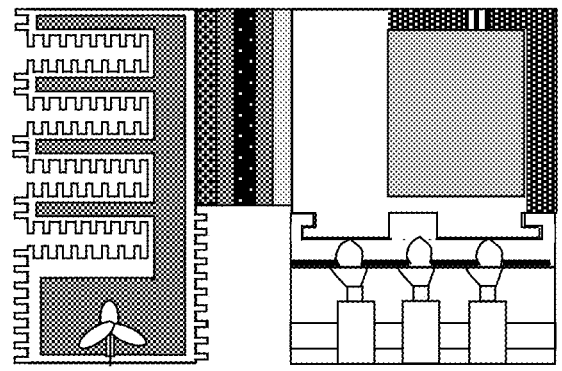
FIG. 5 is a structural illustration showing an internal assembly of the thermoelectric power generation module of FIG. 3 according to the preferred embodiment of the present invention.

In order to for the thermoelectric lighting device of the present invention to meet the market needs practically, the innovative design of different parts of the present invention are further described as follows:

First, the internal structure of the thermoelectric power generation module 003 according to the preferred embodiment of the present invention are illustrated in FIG. 3-FIG. 5. The overall design includes a heat dissipation unit 100, a thermoelectric power generation chip set 110, a heat supply box 120 and a combustion chamber 130 wherein, the thermoelectric power generation chip set 110 generates electrical power based on temperature differences, which is the main electrical power source for the light emitting unit of the present invention. The majority of current thermoelectric power generation chips in the existing technology employ single semi-conducting material for the thermoelectric chips, which has a very limiting application range of temperature differences, and it power generation efficiency is usually relatively low and makes it difficult to reach a practical use level. The present invention, through numerous experimental studies and innovative design, provides the thermoelectric power generation chip set 110 with laminated composite structure in which high temperature range thermoelectric power generation materials is used in the location at which the temperature is relatively higher and the temperature difference is relatively higher while medium to low temperature range thermoelectric power generation materials is used in the location at which the temperature is relatively lower, the temperature is the greatest at a side proximate to the hot side, the temperature is the lowest at a side proximate to the cold side, therefore the thermoelectric power generation chip set 110 of the present invention, from the cold side which is in contact with the heat dissipation unit 100 to the hot side which is in contact with the heat supply unit comprises a plurality of thermoelectric power generation chips of different thermoelectric power generation materials in different layers and in a particular order, wherein a $Bi_2Te_3$—$Bi_2Si_3$ thermoelectric power generation sheet with a relatively high figure-of-merit at a temperature range of 0~300 degree Celsius, which belongs to a low temperature range thermoelectric power generation materials of better quality, is arranged at a position proximal to the cold side; after the $Bi_2Te_3$—$Bi_2Se_3$ thermoelectric power generation sheet, a medium temperature range thermoelectric power generation materials with a relatively high figure-of-merit at a temperature range of 300~600 degree Celsius is arranged. Particularly, this refers to the thermoelectric power generation sheet manufactured by solid solution of PbTe, PbTe and SnTe or PbSe, GeTe or $AgSbTe_2$. At a position proximal to the hot side, high temperature range thermoelectric power generation materials at a temperature above 600 degree Celsius, such as thermoelectric power generation sheet manufactured by Ge—Si alloy and/or MnTe, is arranged. Thus, a laminated structure is formed. Since the different materials have different temperature threshold values, the present invention based on the results of temperature field simulation in the cold and hot sides, select a suitable thermoelectric power generation materials particularly for the different temperature values at different locations such that the entire temperature field between the cold and hot sides has a relatively high figure-of-merit of thermoelectric power generation. Through experimental testing, the thermoelectric power generation chip set 110 with the following structures has a thermoelectric power generation efficiency above 30%, the thermoelectric power generation chip set 110 of the present invention is selected from one of the following structures:

From the cold side to the hot side in a sequential alignment of laminate layers as follows:

(1) "5 mm $Bi_2Te_3$—$Bi_2Se_3$"+"3 mm PbTe"+"3 mm PbSe solid solution"+"8 mm Ge—Si alloy";

(2) "5 mm $Bi_2Te_3$—$Bi_2Se_3$"+"5 mm PbTe and SnTe"+"8 mm Ge—Si alloy";

(3) "5 mm $Bi_2Te_3$—$Bi_2Se_3$"+"3 mm PbSe solid solution"+"3 mm $AgSbTe_2$"+"6 mm Ge—Si alloy"+"3 mm MnTe";

(4) "4 mm $Bi_2Te_3$—$Bi_2Se_3$"+"3 mm GeTe"+"3 mm $AgSbTe_2$"+"4 mm Ge—Si alloy"+"5 mm MnTe";

(5) "5 mm $Bi_2Te_3$—$Bi_2Se_3$"+"3 mm PbSe solid solution"+"3 mm $AgSbTe_2$"+"6 mm MnTe".

According to the present invention, the thermoelectric power generation chip set 110 has an overall rectangular structure with a thickness of 20 mm, the electrical power generated by thermoelectric power generation through different layers of thermoelectric power generation sheets is added in series through internal wiring and then transmitted to the control circuit parts in the mounting top panel through the wiring inside the adjustment rod.

The heat dissipating cold side of the thermoelectric power generation chip set 110 is in close contact with the heat dissipation unit 100, the heat dissipation unit 100 includes a main heat dissipation sheet 101, a micro heat dissipation sheet 102, a heat dissipation sidewall 103, an impeller 104 and a heat dissipation base 105; the heat dissipation base 105 extends vertically upwards to form the heat dissipation sidewall 103, the heat dissipation sidewall 103 has an outer side in close contact to the thermoelectric power generation chip set 110 and an inner side extended vertically to form the main heat dissipation sheet 101, which makes the heat dissipation unit 100 has an overall structure in comb shape while a coolant tank is defined through an inner portion of the heat dissipation base 105, a coolant channel is defined through an inner connecting portion of the main heat dissipation sheet 101 and the heat dissipation sidewall and is channel through to the coolant tank in the heat dissipation base 105, wherein the coolant is a superconducting coolant with high speed conductivity and high thermal expansion coefficient which is manufactured by potassium dichromate and/or potassium sulfate. During the manufacture process of the present invention, this superconducting coolant is injected inside the heat dissipation unit and then undergoes vacuum processing. In this way, the heat generated by the heat dissipation unit, and particularly the heat from the heat dissipation sidewall 103 is conducted to each heat dissipation sheet rapidly through the superconducting coolant, thus dramatically increase the speed and efficiency of heat dissipation. Also, since the thermal expansion coefficient of the superconducting coolant is low, the overpressure safety hazards will not be introduced. In order to further increase the heat dissipation efficiency, the impeller 104 is positioned inside the coolant tank in the heat dissipation base 105. The coolant is driven to circulate through the rotation movement of the impeller 104. Preferably, the impeller is rotated through manual mechanical rotational movement and its knob end is protruded outside the body of the thermoelectric power generation module 001 such that a user can based on his actual need to rotate the knob end manually to rotate the impeller to speed up the circulation of the coolant for increasing the heat dissipation effect. Optionally, the impeller 104 can also be drive through the electrical power generated by the thermoelectric power generation chip set. Furthermore, the micro heat dissipation sheet 102 is arranged on a surface of the main heat dissipation sheet 101, the heat dissipation base 105 and the heat dissipation sidewall 103 of which the surface is not in close contact with the thermoelectric power generation chip set 110, and the micro heat dissipation sheet 102 further conduct the heat from the main heat dissipation sheet 101 by the coolant to external environment. The micro heat dissipation sheet 102 can be made by heat dissipation materials which comprises additional fiber capillary tubes in the middle. The heat dissipation unit 100 can be made in materials with high conductivity, such as copper or aluminum. In particular, each main heat dissipation sheet 101 has a thickness of 8-15 mm, preferably 10-12 mm and has a gap of 8-15 mm, preferably 10 mm, between each two main heat dissipation sheets, wherein each micro heat dissipation sheet 102 has a thickness of 0.5-2 mm, preferably 0.8-1.5 mm, and has a gap of 1.5-3 mm, preferably 2.5 mm between each two micro heat dissipation sheets, while fiber capillary tubes in the middle are added. Through experimental testing, the heat dissipation unit with the above structural specifications has a relatively good heat dissipation effect and meet the requirements of compact size and portability for the lighting device of the present invention.

The hot side of the thermoelectric power generation chip set 110 is in proximal to the heat supply box 120. The heat supply box 120, as shown in FIG. 3 of the drawings, comprises a copper wall 121, a water tank 122, an insulating wall 123, an exhaust holes 124, a connecting sliding groove 125, and a copper base 126. The heat supply box 120 has an overall structure of rectangular box structure and forms the copper wall 121 with a thickness greater than 20 mm on a side proximal to the thermoelectric power generation chip set 110. The copper wall 121 has a bottom portion integrally and outwardly extended vertically to the copper base 126, the copper base 126 has a thickness smaller than 20 mm, thus the high conductivity function of copper can be used to conduct heat transfer rapidly and timely for the thermoelectric power generation chip set 110. On the other side of the copper wall 121 and an upper side of the copper base 126, the water tank 122 is provided for water storage such that the high specific heat capacity of water is utilized for heat storage. The top and the exterior sidewall of the water tank 122 is made in insulating materials to form the insulating wall 123. In other words, the entire bottom and the side proximal to the thermoelectric power generation chip set 110 of the water tank 122 are made in copper materials while the other sidewall and the top of the water tank 122 are made in insulating materials, therefore the heat inside is not easily loss, and the copper materials and the insulating materials are fittingly connected to each other to ensure a sealed state of the water tank. In order to balance the pressure from steam, the exhaust hole 124 is arranged on the insulating wall 123 which is positioned on a top portion of the water tank 122 and a steam stopper is provided for the exhaust hole 124 which only permit the discharge of steam but stop the water in liquid state to flow outside.

The connecting sliding groove 125 is provided on two sides of the copper base 126 such that the heat supply box 120 and the combustion chamber 130 are tightly connected. A connecting magnet 127 is provided on a front side of the copper base 126 for attracting to a magnetic block 131 on a top side wall of the combustion chamber such that the combustion chamber is tightly integrated to the bottom of the heat supply box and provide heat source for the heat supply box.

In the bottom of the heat supply box, the combustion chamber 130 is arranged. The combustion chamber 130 has a rectangular box body which is similar to the heat supply box. The rectangular box body comprises a stationary panel 135 on a bottom portion thereof and a plurality of positioning holes on the stationary panel 135. The size of the positioning hole matches the size of commonly used burning candle, alcohol lamp, and etc. (burning candle is used as an example in the following description). During application, the bottom of the candle is positioned into the positioning hole such that the candle can be secure into position inside the combustion chamber. Preferably, the positioning holes are aligned in a plurality of rows on the stationary panel 135 starting from the side proximal to the thermoelectric power generation chip set 110 while the row of positioning holes which face the copper wall 121 directly has a greater number of positioning holes. A flame control plate 136 is provided in the upper portion proximal to an opening of the rectangular box body. The structure of the flame control plate 136 is illustrated in FIG. 4 of the drawings, which comprises an extendable plate 137 and an adjustment bar 139. The extendable plate 137 is formed by overlapping cover plates and is connected to the adjustment bar 139 through a link drive mechanism. Through operating the adjustment bar 139, an extension level of the extendable plate 137 can be adjusted, hence changing a width size of a flame outlet 138 between the extension plates while the flame outlet 138 remains its position on the positioning hole, which is directly on the candle flame. Accordingly, through operating the adjustment bar 139, the width at a horizontal direction of the extendable plate 137 can be adjusted, hence changing the width size of the flame outlet 138 which is positioned at the candle flame, thus a size of the candle flame of the candle can be adjusted effectively and an adjustment control for the heat supplied from the combustion chamber is realized. Besides, when heat supply is not required, it is only needed to rotate the adjustment bar 139 to the maximum (the extension plates are extended to the maximum) such that the flame outlet 138 is completely closed and the heat supply is stopped. Accordingly, this flame control plate 136 provided by the present invention can conveniently provide adjustment control for the heat supply in the combustion chamber. A connecting ribs 132 is provided on a top portion at two sidewalls of the rectangular box body, the combustion chamber is secured into position to a bottom of the heat supply box through inserting the connecting ribs 132 into the corresponding connecting groove 125 of the heat supply box. Also, a magnetic block 131 is provided on a top side wall of the combustion chamber, that the magnetic block 131 is corresponding to the position of the connecting magnet 127 of the heat supply box, such that through inserting the connecting ribs 132 of the combustion chamber into the corresponding connecting grooves 125 of the heat supply box and sliding forward into position, the magnetic block 131 and the connecting magnet are mutually attracted, thereby the combustion chamber is tightly connected into position to the heat supply box. Meanwhile, the candle flame in the combustion chamber is facing the copper base directly and provide heat supply to the copper base. The sidewall of the combustion chamber which is positioned proximal to the thermoelectric power generation chip set 110 is made in insulating materials to form an insulation sidewall 133 so as to minimize the heat transfer to the heat dissipation unit from the combustion chamber, while the other sidewalls of the combustion chamber has oxygen supply holes.

Referring to FIG. 5 of the drawings, the structural assembly illustration of the above heat dissipation unit 100, the thermoelectric power generation chip set 110, the heat supply box 120 and the combustion chamber 130 of the thermoelectric power generation module 001 according to the present invention is provided. As shown in the drawings figure, the heat dissipation unit 100 is in tight contact to the heat dissipating cold side of the thermoelectric power generation chip set, the hot side of the thermoelectric power generation chip set is in tight contact to the copper wall 121 of the heat supply box 120, and the bottom of the heat supply box 120 is connected to the combustion chamber 130. During operation, the candle is burning inside the combustion chamber, the candle flame passes through the flame control plate 136 and then provides heating to the copper base 126 of the heat supply box in which the majority of heat is conducted directly to the copper wall 121 which is integrally constructed with the copper base and the remaining heat is conducted to the water tank 122 through the copper base and is stored in the water, Meanwhile, the heat from the copper wall 121 is timely conducted to the hot side of the thermoelectric power generation chip set while the heat dissipation unit operates to dissipate the heat timely from the cold side of the thermoelectric power generation chip set through the superconducting coolant, thereby a relatively large and stable temperature difference distribution is formed in the thermoelectric power generation chip set. Through thermoelectric power generation, this temperature difference distribution is transformed into electrical power output.

Figure 6:
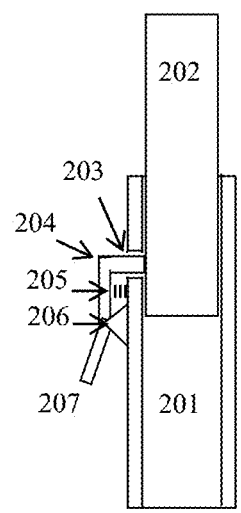
FIG. 6 is a sectional illustration showing the adjustment rod of the thermoelectric lighting device according to the preferred embodiment of the present invention.

The electrical power output from the thermoelectric power generation module 001 is output upwardly through connecting wires. The connecting wires is arranged in the inner cavity of the adjustment rod 002. The adjustment rod 002 connects the mounting top panel 004 and the thermoelectric power generation module 001 in an adjustable manner. Through the innovative adjustment rod 002 of the present invention, the adjustment of illumination direction of the light emitting unit can be realized through a very quick and simple method. In particular, the adjustment rod 002 comprises a main rod 201 and am extendable rod 202. As shown in FIG. 6 of the drawings, the extendable rod 202 is extended inside the main rod 201, the main rod 201 has a bottom end connected to a top surface of a body of the thermoelectric power generation module 001 through a rotary shaft, which is shown in FIG. 2, such that rotation angle adjustment of the main rod 201 can be achieved. A locking device for locking the extendable rod 202 into position is provided on a sidewall near an open end of the main rod 201. The locking device comprises a gap 203 opening on the main rod 201, a lever 204, a spring 205, a triangular support 206 and a pushing handle 207, the triangular support 206 is secured on an outer sidewall of the main rod 201 at a position close to the gap 203, the lever 204 comprises a pressing block in a top portion vertically inserted into the gap 203, the lever 204 has a middle portion rotatably connected onto the triangular support 206, and a bottom end of the lever 204 defines the pushing handle 207 for facilitating pressing action, the spring 205 is provided between the gap 203 and the triangular support 206, the spring 205 has two ends secured onto an outer sidewall of the lever 204 and the main rod 201 respectively such that the pressing block of the lever 204 penetrates through the gap 203 to resiliently pressing against the extendable rod 202 inside the main rod 201 and locking the extendable rod 202 into a particular position inside the main rod. When adjustment of the adjustment rod is required, through pressing the pushing handle 207, the lever 204 is rotated along the triangular support 206, the pressing block at the end of the lever 204 is extended outside the gap 203, hence the extendable rod 202 can be freely adjusted inside the main rod 201. The top end of the extendable rod 202 in installed onto the inner surface of the mounting top panel 004 through a rotatory shaft connection, therefore the mounting top panel 004 is capable of rotation angle adjustment with respect to the adjustment rod 002. Preferably, two parallel adjustment rods 002 are provided, which is shown in FIG. 2 of the drawings.

Figure 7:
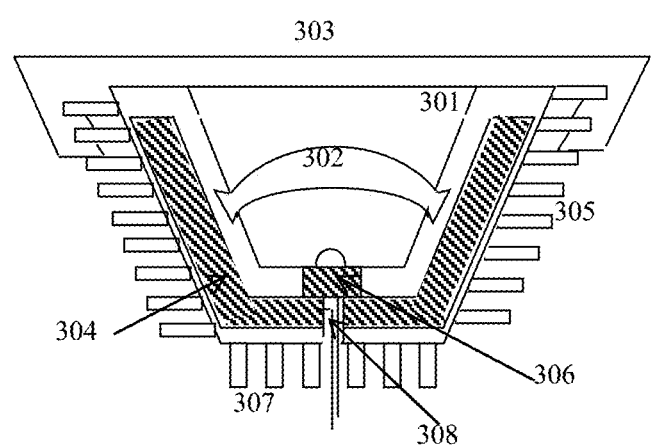
FIG. 7 is a structural illustration showing the light emitting unit of the thermoelectric lighting device according to the preferred embodiment of the present invention.

One or more light emitting units 003 are installed onto the inner surface of the mounting top panel 004. The structure of the light emitting unit 003 is shown in FIG. 7, which comprises a reflective cup 301, a condenser lens 302, a lighting cover 303, a thermoelectric power generation sheet 304, heat dissipation fins 305, a LED 306 and installation fins 307, wherein an installation spot is arranged for the LED 306 at a bottom portion of the reflective cup 301, a wiring hole 308 is provided on a center in a bottom of the installation spot, a reflective film is coated onto an inner wall surface of the reflective cup 301, a wedged-shaped groove is provided circumferentially at a position on an inner wall of the reflective cup proximal to the LED 306 for mounting the condenser lens 302.

The condenser lens 302 has a central portion defining a converging lens structure which is made in transparent resin, and a peripheral portion defining a resilient flange structure which is compressible. During installation, the condenser lens 302 is mounted onto the inner side of the reflective cup 301 into position through pressing the resilient flange at the peripheral portion of the condenser lens 302 into the wedged-shaped groove of the reflective cup 301. The LED is positioned near the focal point of the condenser lens such that light emitted from the point sources of LED is converted to parallel light output through the condenser lens. The reflective cup 301 is made in aluminum materials and the thermoelectric power generation sheet 304 is positioned at an inner side of a cup wall of the reflective cup 301, the thermoelectric power generation sheet 304 has a shape similar to that of the reflective cup 301 and is a $Be_2Te_3$—$Bi_2Se_3$ thermoelectric power generation sheet with a thickness of 3-5 mm thickness of which a wiring opening is provided on a bottom center portion for the wiring hole 308. The thermoelectric power generation sheet 304 defines one side which is proximal to the inner sidewall of the reflective cup 301 as the hot side, which is arrange for absorbing the heat from the reflective surface of the reflective cup and the LED light source, and the outer side of the thermoelectric power generation sheet 304 which is proximal to the outer sidewall of the thermoelectric power generation sheet 304 as the cold side.

The outer side of the reflective cup comprises a plurality of heat dissipation fins 305. Through the heat dissipation fins 305, the heat from the reflective cup is dissipated while the temperature at the outer side of the thermoelectric power generation sheet 304 is reduced, therefore a temperature difference is formed in the thermoelectric power generation sheet 304, through which the electrical power is generated based on the temperature difference and is guided through the wiring holes to the mounting top panel. The thermoelectric power generation sheet 304 is arranged in a spiral pattern in the outer side of the reflective cup. The reflective cup 301 has a cup opening and the lighting cover 303 is installed. The lighting cover 303 has a spiral groove at an inner edge in its peripheral. The spiral groove is screwed with the heat dissipation fins 305 on the outer side of the reflective cup 301 to install the lighting cover 303 onto the reflective cup 301, that this type of design is very convenient for light cover installation. The reflective cup 301 has a bottom portion at which the installation fins 307 are provided. The installation fins 307 serves as the heat dissipation fins for the reflective cup itself as well as the mounting parts for installation of the reflective cup onto the mounting top panel 004. In particular, in the inner surface of the mounting top panel 004 at a position for installation of the light emitting unit, protruded plates which is corresponding to the gaps of the installation fins 307 are provided. Through inserting the protruded plates into the gaps of the installation fins 307 and a screw connection which penetrates the protruded plates, and the installation fins 307 at a horizontal direction, the light emitting unit is installed on the inner surface of the mounting top panel. Through testing under practical use, the present invention is innovative in providing the thermoelectric power generation sheet 304 in the reflective cup, thus effectively utilizes the heat from the light emitting unit. Even though the electrical power output is not great, this is very useful for the type of portable lighting device which is not connected to external electrical power of the present invention. The electrical power generated by the thermoelectric power generation sheet 304 is conducted to the mounting top panel through connecting wires.

Inside the mounting top panel 004, the control circuit parts are arranged, which at least includes a power control circuit for controlling the power generated by the thermoelectric power generation module 001 and the light emitting unit 003 and a light emitting driving circuit for controlling the LED of the light emitting unit. The power control circuit provides power for driving the light emission of the LED and comprises a selective toggle switch. Since the power sources of the power control circuit includes electrical power from the thermoelectric power generation module 001 and electrical power from the light emitting unit 003, the present invention is innovative in utilizing a switching mechanism between a series connection and a parallel connection for these two electrical power sources in the thermoelectric lighting device of the present invention. In other words, the power control circuit includes the selective toggle switch through which switching between a series connection or a parallel connection for electrical power from the thermoelectric power generation module 001 and electrical power from the light emitting unit 003 are realized. When the thermoelectric lighting device of the present invention is required for long lasting lighting, a parallel connection of electrical power from the thermoelectric power generation module 001 and electrical power from the light emitting unit 003 is selected. When the thermoelectric lighting device of the present invention is required for high brightness lighting effect, a series connection of electrical power from the thermoelectric power generation module 001 and electrical power from the light emitting unit 003 is selected. Through the power control circuit, power to the light emitting driving circuit is provided. The light emitting driving circuit is connected through the wiring holes 308 by connecting wire to the LED point light source inside the reflective cup. Also, the power control circuit may further comprise a power storage module which stores the thermoelectric power generated and a power storage module which provides charging function through USB.

The portable thermoelectric lighting device of the present invention, in the absence of external electrical power sources, utilizes and converts the heat from burning of candles and alcohol lamp to electrical power for the LED to drive the lighting. This type of lighting device is very suitable for use in bivouac in the field. That is to say, this type of lighting devices overcome the problems of battery powered or AC powered dependence of the existing lighting devices, effectively utilizes the high brightness properties of LED while provides great convenience to carry and use, thus offering a very wide market prospects. As stated in the background, the technology of thermoelectric power generation has already existed for a long time. However, a product which is practical and marketable is not realized. The present invention integrates long-term experimental studies and testing to provide innovative design in the thermoelectric power generation materials and structures, the heat dissipation and heating structures and the light emitting structure so as to achieve a thermoelectric power generation lighting devices which is truly practical for use and marketable.

The above preferred embodiments have been shown and described for the purposes of illustrating the functional and structural principles of the present invention and is not intended to be limiting. The present invention includes all modifications encompassed within the spirit and scope of the present invention and changes without departure from its principles by the person skilled in the art. The present invention includes the scope as claimed in the following claims.

What is claimed is:

1. A portable lighting device with thermoelectric power source, comprising:
    a thermoelectric power generation module, including a heat dissipation unit, a thermoelectric power generation chip set with hot and cold sides, a heat supply box and a combustion chamber, wherein said cold side of said thermoelectric power generation chip set is in close contact with said heat dissipation unit, said hot side of said thermoelectric power generation chip set is in close contact with said heat supply box, and said heat supply box has a bottom portion connected to said combustion chamber;
    an adjustment rod;
    a mounting top panel; and
    a light emitting unit mounted onto a surface of said mounting top panel, wherein said mounting top panel and said thermoelectric power generation module are connected through said adjustment rod;
    said thermoelectric power generation chip set in said cold side comprises a $Bi_2Te_3$—$Bi_2Se_3$ thermoelectric power generation sheet at a temperature range of 0~300 degree Celsius, then a solid solution of PbTe, PbTe and SnTe or PbSe at a temperature range of 300~600 degree Celsius after said $Bi_2Te_3$—$Bi_2Se_3$ thermoelectric power generation sheet, and a GeTe and/or $AgSbTe_2$ thermoelectric power generation sheet, and in said hot side comprises a Ge—Si alloy and/or MnTe thermoelectric power generation sheet at a temperature above 600 degree Celsius.

2. The portable lighting device with thermoelectric power source according to claim 1, characterized in that: said heat supply box comprises a copper wall, a water tank, an insulating wall, an exhaust holes, a connecting sliding groove, a copper base and a connecting magnet, said heat supply box has an overall structure of rectangular box structure and forms said copper wall with a thickness greater than 20 mm on a side close to said thermoelectric power generation chip set, said copper wall has a bottom portion integrally and outwardly extended vertically to said copper base, said copper base has a thickness smaller than 20 mm, said copper wall and said copper base are arranged for forming two wall panels for said water tank, the other panels of said water tank are formed by said insulating wall, said exhaust hole is arranged on said insulating wall which is positioned on a top portion of said water tank, said connecting groove are provided on two sides of said copper base, said connecting magnet is provided on a front side of said copper base.

3. The portable lighting device with thermoelectric power source according to claim 1, characterized in that: said light emitting unit comprises a reflective cup, a condenser lens, a lighting cover, a thermoelectric power generation sheet, heat dissipation fins, a LED and installation fins, an installation spot is arranged for said LED at a bottom portion of said reflective cup, wiring hole is provided on a center in a bottom of said installation spot, a reflective film is coated onto an inner wall surface of said reflective cup, a wedged-shaped groove is provided circumferentially at a position on an inner wall of said reflective cup and is close to said LED, a converging lens structure is defined by a central portion of said condenser lens and a resilient flange structure, which is compressible, is defined by a peripheral portion of said condenser lens, said thermoelectric power generation sheet is positioned at an inner side of a cup wall of said reflective cup, said thermoelectric power generation sheet is a $Bi_2Te_3$—$Bi_2Se_3$ thermoelectric power generation sheet with a thickness of 3-5 mm thickness in which a wiring opening is provided on a bottom center portion thereof, a bottom surface of said LED is in contact with said thermoelectric power generation sheet, said reflective cup has an outer side on which a plurality of heat dissipation fins in a spiral pattern are arranged, a spiral groove is provided peripherally at an inner edge of said lighting cover, said spiral groove is screwed with said spiral pattern of said heat dissipation fins on said outer side of said reflective cup to install said lighting cover onto said reflective cup, said reflective cup has a bottom portion at which said installation fins are provided.

4. The portable lighting device with thermoelectric power source according to claim 1, characterized in that: said heat supply box comprises a copper wall, a water tank, an insulating wall, an exhaust holes, a connecting sliding groove, a copper base and a connecting magnet, said heat supply box has an overall structure of rectangular box structure and forms said copper wall with a thickness greater than 20 mm on a side close to said thermoelectric power generation chip set, said copper wall has a bottom portion integrally and outwardly extended vertically to said copper base, said copper base has a thickness smaller than 20 mm, said copper wall and said copper base are arranged for forming two wall panels for said water tank, the other panels of said water tank are formed by said insulating wall, said exhaust hole is arranged on said insulating wall which is positioned on a top portion of said water tank, said connecting groove are provided on two sides of said copper base, said connecting magnet is provided on a front side of said copper base.

5. The portable lighting device with thermoelectric power source according to claim 1, characterized in that: said light emitting unit comprises a reflective cup, a condenser lens, a lighting cover, a thermoelectric power generation sheet, heat dissipation fins, a LED and installation fins, an installation spot is arranged for said LED at a bottom portion of said reflective cup, wiring hole is provided on a center in a bottom of said installation spot, a reflective film is coated onto an inner wall surface of said reflective cup, a wedged-shaped groove is provided circumferentially at a position on an inner wall of said reflective cup and is close to said LED, a converging lens structure is defined by a central portion of said condenser lens and a resilient flange structure, which is compressible, is defined by a peripheral portion of said condenser lens, said thermoelectric power generation sheet is positioned at an inner side of a cup wall of said reflective cup, said thermoelectric power generation sheet is a $Bi_2Te_3$—$Bi_2Se_3$ thermoelectric power generation sheet with a thickness of 3-5 mm thickness in which a wiring opening is provided on a bottom center portion thereof, a bottom surface of said LED is in contact with said thermoelectric power generation sheet, said reflective cup has an outer side on which a plurality of heat dissipation fins in a spiral pattern are arranged, a spiral groove is provided peripherally at an inner edge of said lighting cover, said spiral groove is screwed with said spiral pattern of said heat dissipation fins on said outer side of said reflective cup to install said lighting cover onto said reflective cup, said reflective cup has a bottom portion at which said installation fins are provided.

6. The portable lighting device with thermoelectric power source according to claim 1, characterized in that: said thermoelectric power generation chip set has a thermoelectric power generation efficiency above 30% and is constructed by one of the followings:
(1) $Bi_2Te_3$—$Bi_2Se_3$ with 5 mm thickness/PbTe with 3 mm thickness/PbSe solid solution with 3 mm thickness/Ge—Si alloy with 8 mm thickness;
(2) $Bi_2Te_3$—$Bi_2Se_3$ with 5 mm thickness/PbTe and SnTe with 3 mm thickness/Ge—Si alloy with 8 mm thickness;
(3) $Bi_2Te_3$—$Bi_2Se_3$ with 5 mm thickness/PbSe solid solution with 3 mm thickness/$AgSbTe_2$ with 3 mm thickness/Ge—Si alloy with 6 mm thickness/MnTe with 3 mm thickness;
(4) $Bi_2Te_3$—$Bi_2Se_3$ with 4 mm thickness/GeTe with 3 mm thickness/$AgSbTe_2$ with 3 mm thickness/Ge—Si alloy with 4 mm thickness/MnTe with 5 mm thickness;
(5) $Bi_2Te_3$—$Bi_2Se_3$ with 5 mm thickness/PbSe solid solution with 3 mm thickness/$AgSbTe_2$ with 3 mm thickness/MnTe with 6 mm thickness.

7. The portable lighting device with thermoelectric power source according to claim 6, characterized in that: said heat dissipation unit comprises a main heat dissipation sheet, a micro heat dissipation sheet, a heat dissipation sidewall, an impeller and a heat dissipation base; said heat dissipation base extends vertically upwards to form said heat dissipation sidewall, said heat dissipation sidewall has an outer side in close contact to said thermoelectric power generation chip set and an inner side extended vertically to form said main heat dissipation sheet, said heat dissipation unit has an overall structure in comb shape, a coolant tank is defined through an inner portion of said heat dissipation base, a coolant channel is defined through an inner connecting portion of said main heat dissipation sheet and said heat dissipation sidewall and is channel through to said coolant tank in said heat dissipation base, said coolant tank contains coolant and the coolant is a superconducting coolant manufactured by potassium dichromate and/or potassium sulfate, said impeller is positioned inside said coolant tank in said heat dissipation base, said micro heat dissipation sheet is arranged on a surface of said main heat dissipation sheet, said heat dissipation base and said heat dissipation sidewall of which said surface is not in close contact with said thermoelectric power generation chip set.

8. The portable lighting device with thermoelectric power source according to claim 1, characterized in that: said heat dissipation unit comprises a main heat dissipation sheet, a micro heat dissipation sheet, a heat dissipation sidewall, an impeller and a heat dissipation base; said heat dissipation base extends vertically upwards to form said heat dissipation sidewall, said heat dissipation sidewall has an outer side in close contact to said thermoelectric power generation chip set and an inner side extended vertically to form said main heat dissipation sheet, said heat dissipation unit has an overall structure in comb shape, a coolant tank is defined through an inner portion of said heat dissipation base, a coolant channel is defined through an inner connecting portion of said main heat dissipation sheet and said heat dissipation sidewall and is channel through to said coolant tank in said heat dissipation base, said coolant tank contains coolant and the coolant is a superconducting coolant manufactured by potassium dichromate and/or potassium sulfate, said impeller is positioned inside said coolant tank in said heat dissipation base, said micro heat dissipation sheet is arranged on a surface of said main heat dissipation sheet, said heat dissipation base and said heat dissipation sidewall of which said surface is not in close contact with said thermoelectric power generation chip set.

9. The portable lighting device with thermoelectric power source according to the claim 8, characterized in that: said micro heat dissipation sheet is made by heat dissipation materials which comprises additional fiber capillary tubes in the middle, said heat dissipation unit is made in copper or aluminum, each of said main heat dissipation sheet has a thickness of 8-15 mm and has a gap of 8-15 mm with each other, each of said micro heat dissipation sheet has a thickness of 0.5-2 mm and has a gap of 1.5-3 mm with each other.

10. The portable lighting device with thermoelectric power source according to claim 1, characterized in that: said combustion chamber has a rectangular box body, said rectangular box body comprises a stationary panel on a bottom portion thereof, a plurality of positioning holes for combustion heat source on said stationary panel, a flame control plate is provided in the upper portion near an opening of said rectangular box body, said flame control plate is arranged for adjusting a flame size of said combustion heat source positioned in said stationary panel, a connecting ribs is provided on a top portion at two sidewalls of said rectangular box body, said combustion chamber is connected to a bottom of said heat supply box through inserting said connecting ribs into said corresponding connecting groove of said heat supply box, a magnetic block is provided on a top side wall of said box body which is attracted to and corresponded to said connecting magnet of said heat supply box for accurate alignment of said combustion chamber and said heat supply box, said combustion chamber has a sidewall which is close to said thermoelectric power generation chip set forms an insulation sidewall, the other sidewalls of the box body of said combustion chamber has oxygen supply holes.

11. The portable lighting device with thermoelectric power source according to the claim 10, characterized in that: said flame control plate comprises an extendable plate and an adjustment bar, said extendable plate is formed by overlapping cover plates and is connected to said adjustment bar through a link drive mechanism, through operating said adjustment bar, an extension level of said extendable plate can be adjusted, hence changing a size of a flame outlet between each said extension plate while said flame outlet remains its position on said positioning hole.

12. The portable lighting device with thermoelectric power source according to claim 1, characterized in that: said adjustment rod comprises a main rod and am extendable rod, said extendable rod extended inside said main rod, said main rod has a bottom end connected to a top surface of a body of said thermoelectric power generation module through a rotary shaft, an illumination angle of said light emitting unit is adjusted through adjusting an angle between said mounting top panel and said adjustment rod, and an angle between said adjustment rod and said thermoelectric power generation module, a locking device for locking said extendable rod into position is provided on a sidewall at an open end of said main rod.

13. The portable lighting device with thermoelectric power source according to the claim 12, characterized in that: said locking device comprises a gap opening on said main rod, a lever, a spring, a triangular support and a pushing handle, said triangular support is secured on an outer sidewall of said main rod at a position close to said gap, said lever comprises a pressing block in a top portion vertically inserted into said gap, said lever has a middle portion rotatably connected onto said triangular support, and a bottom end of said lever defines said pushing handle for facilitating pressing action, said spring is provided between said gap and said triangular supporter, said spring has two ends secured onto an outer sidewall of said lever and said main rod respectively such that said pressing block of said lever penetrates through said gap to resiliently pressing against said extendable rod inside said main rod and locking said extendable rod into position inside said main rod.

14. The portable lighting device with thermoelectric power source according to claim 1, characterized in that: a power control circuit for controlling the power generated by said thermoelectric power generation module and said light emitting unit and a light emitting driving circuit for controlling said LED of said light emitting unit are provided inside said mounting panel, said power control circuit comprises a selective toggle switch, said selective toggle switch enables switching between a series connection or a parallel connection for power generation from said thermoelectric power generation module and said light emitting unit.

15. The portable lighting device with thermoelectric power source according to the claim 14, characterized in that: said power control circuit further comprises a power storage module with an external USB port, said power storage module is capable of automatically storing the thermoelectric power generated internally and charging by utilizing external power through said USB port.

16. The portable lighting device with thermoelectric power source according to claim 1, characterized in that: said thermoelectric power generation chip set has a thermoelectric power generation efficiency above 30% and is constructed by one of the followings:

(1) $Bi_2Te_3$—$Bi_2Se_3$ with 5 mm thickness/PbTe with 3 mm thickness/PbSe solid solution with 3 mm thickness/Ge—Si alloy with 8 mm thickness;
(2) $Bi_2Te_3$—$Bi_2Se_3$ with 5 mm thickness/PbTe and SnTe with 3 mm thickness/Ge—Si alloy with 8 mm thickness;
(3) $Bi_2Te_3$—$Bi_2Se_3$ with 5 mm thickness/PbSe solid solution with 3 mm thickness/$AgSbTe_2$ with 3 mm thickness/Ge—Si alloy with 6 mm thickness/MnTe with 3 mm thickness;
(4) $Bi_2Te_3$—$Bi_2Se_3$ with 4 mm thickness/GeTe with 3 mm thickness/$AgSbTe_2$ with 3 mm thickness/Ge—Si alloy with 4 mm thickness/MnTe with 5 mm thickness;
(5) $Bi_2Te_3$—$Bi_2Se_3$ with 5 mm thickness/PbSe solid solution with 3 mm thickness/$AgSbTe_2$ with 3 mm thickness/MnTe with 6 mm thickness.

17. The portable lighting device with thermoelectric power source according to claim 16, characterized in that: said heat dissipation unit comprises a main heat dissipation sheet, a micro heat dissipation sheet, a heat dissipation sidewall, an impeller and a heat dissipation base; said heat dissipation base extends vertically upwards to form said heat dissipation sidewall, said heat dissipation sidewall has an outer side in close contact to said thermoelectric power generation chip set and an inner side extended vertically to form said main heat dissipation sheet, said heat dissipation unit has an overall structure in comb shape, a coolant tank is defined through an inner portion of said heat dissipation base, a coolant channel is defined through an inner connecting portion of said main heat dissipation sheet and said heat dissipation sidewall and is channel through to said coolant tank in said heat dissipation base, said coolant tank contains coolant and the coolant is a superconducting coolant manufactured by potassium dichromate and/or potassium sulfate, said impeller is positioned inside said coolant tank in said heat dissipation base, said micro heat dissipation sheet is arranged on a surface of said main heat dissipation sheet, said heat dissipation base and said heat dissipation sidewall of which said surface is not in close contact with said thermoelectric power generation chip set.

18. The portable lighting device with thermoelectric power source according to claim 17, characterized in that: said heat supply box comprises a copper wall, a water tank, an insulating wall, an exhaust holes, a connecting sliding groove, a copper base and a connecting magnet, said heat supply box has an overall structure of rectangular box structure and forms said copper wall with a thickness greater than 20 mm on a side close to said thermoelectric power generation chip set, said copper wall has a bottom portion integrally and outwardly extended vertically to said copper base, said copper base has a thickness smaller than 20 mm, said copper wall and said copper base are arranged for forming two wall panels for said water tank, the other panels of said water tank are formed by said insulating wall, said exhaust hole is arranged on said insulating wall which is positioned on a top portion of said water tank, said connecting groove are provided on two sides of said copper base, said connecting magnet is provided on a front side of said copper base.

19. The portable lighting device with thermoelectric power source according to claim 18, characterized in that: said light emitting unit comprises a reflective cup, a condenser lens, a lighting cover, a thermoelectric power generation sheet, heat dissipation fins, a LED and installation fins, an installation spot is arranged for said LED at a bottom portion of said reflective cup, wiring hole is provided on a center in a bottom of said installation spot, a reflective film is coated onto an inner wall surface of said reflective cup, a wedged-shaped groove is provided circumferentially at a position on an inner wall of said reflective cup and is close to said LED, a converging lens structure is defined by a central portion of said condenser lens and a resilient flange structure, which is compressible, is defined by a peripheral portion of said condenser lens, said thermoelectric power generation sheet is positioned at an inner side of a cup wall of said reflective cup, said thermoelectric power generation sheet is a $Bi_2Te_3$—$Bi_2Se_3$ thermoelectric power generation sheet with a thickness of 3-5 mm thickness in which a wiring opening is provided on a bottom center portion thereof, a bottom surface of said LED is in contact with said thermoelectric power generation sheet, said reflective cup has an outer side on which a plurality of heat dissipation fins in a spiral pattern are arranged, a spiral groove is provided peripherally at an inner edge of said lighting cover, said spiral groove is screwed with said spiral pattern of said heat dissipation fins on said outer side of said reflective cup to install said lighting cover onto said reflective cup, said reflective cup has a bottom portion at which said installation fins are provided.

\* \* \* \* \*